(12) United States Patent
Nishibe et al.

(10) Patent No.: US 6,363,950 B2
(45) Date of Patent: Apr. 2, 2002

(54) APPARATUS FOR PROCESSING SUBSTRATE USING PROCESS SOLUTIONS HAVING DESIRED MIXING RATIOS

(75) Inventors: Yukinobu Nishibe, Kamakura; Akinori Iso, Yokohama, both of (JP)

(73) Assignee: Shibaura Mechatronics Corporation, Kanagawa-ken (JP)

( * ) Notice: Subject to any disclaimer, the term of this patent is extended or adjusted under 35 U.S.C. 154(b) by 0 days.

(21) Appl. No.: 09/935,034

(22) Filed: Aug. 22, 2001

Related U.S. Application Data

(62) Division of application No. 09/644,170, filed on Aug. 23, 2000, now Pat. No. 6,299,697.

(30) Foreign Application Priority Data

Aug. 25, 1999 (JP) ............................................ 11-238493
Sep. 27, 1999 (JP) ............................................ 11-273031

(51) Int. Cl.[7] ................................................. C23G 1/02
(52) U.S. Cl. ......................... 134/57 R; 134/3; 134/18; 134/25.4; 134/25.5; 134/26; 134/28; 134/30; 134/32; 134/33; 134/36; 134/41; 134/42
(58) Field of Search ............................... 134/57 R, 95.3, 134/98.1, 100.1, 153, 902, 3, 18, 25.4, 25.5, 26, 28, 30, 32, 33, 36, 41, 42

(56) References Cited

U.S. PATENT DOCUMENTS

| | | | |
|---|---|---|---|
| 5,634,980 A | 6/1997 | Temita et al. | 134/3 |
| 5,637,151 A | 6/1997 | Schulz | 134/2 |
| 5,679,171 A | 10/1997 | Saga | 134/3 |
| 5,853,491 A | 12/1998 | Schulz | 134/2 |
| 5,908,509 A | 6/1999 | Oleson et al. | 134/13 |
| 6,013,156 A * | 1/2000 | Holbrook et al. | 156/345 |
| 6,092,539 A * | 7/2000 | Chang et al. | 134/57 R |
| 6,197,150 B1 * | 3/2001 | Kwag et al. | 156/345 |
| 6,261,845 B1 * | 7/2001 | Verhaverbeke et al. | 436/55 |

FOREIGN PATENT DOCUMENTS

| | | |
|---|---|---|
| JP | 629270 | 10/1994 |
| JP | 6291098 | 2/1999 |

* cited by examiner

*Primary Examiner*—Sharidan Carrillo
(74) *Attorney, Agent, or Firm*—Volpe & Koenig, P.C.

(57) ABSTRACT

An apparatus for processing a substrate in which the substrate is successively processed with different kinds of process solution. A spin chuck supports the substrate. A driving source rotates the spin chuck A nozzle member supplies a first process solution prepared by mixing sulfuric acid and a hydrogen peroxide solution at a predetermined mixing ratio to the substrate. A switching mechanism selects the sulfuric acid, the hydrogen peroxide solution and the second process solution supplied to the nozzle member A concentration adjusting mechanism adjusts the ratio of sulfuric acid to the hydrogen peroxide solution, which collectively form the first process solution, supplied to the nozzle member. A control device controls the supply of sulfuric acid, the hydrogen peroxide solution and the second process solution, which is switched by the switching mechanism.

9 Claims, 4 Drawing Sheets

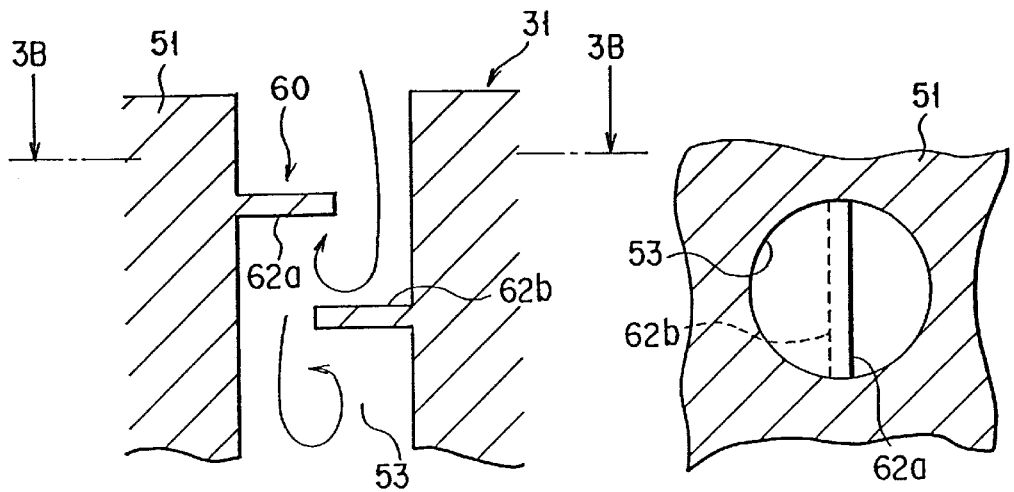
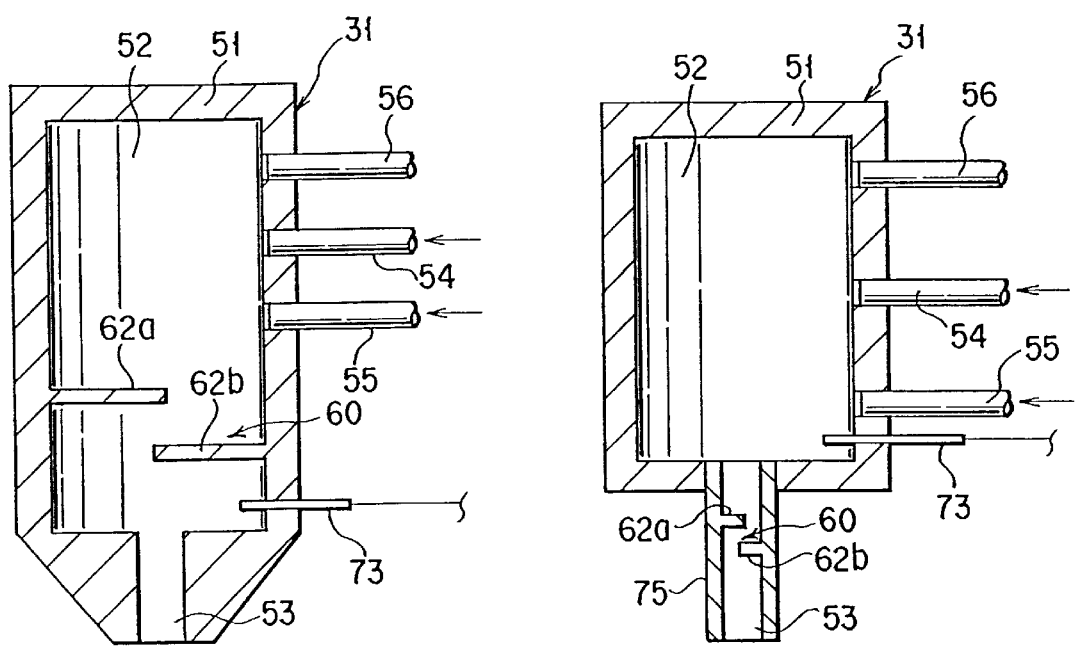
FIG. 3A  FIG. 3B
FIG. 5  FIG. 6

APPARATUS FOR PROCESSING SUBSTRATE USING PROCESS SOLUTIONS HAVING DESIRED MIXING RATIOS

CROSS-REFERENCE TO RELATED APPLICATIONS

This application is a divisional of U.S. patent application No. 09/644,170 filed Aug. 23, 2000, now issued as U.S. Pat. No. 6,299,697, which claims the benefit of and priority from Japanese Patent Applications No. 11-238493, filed Aug. 25, 1999, and No. 11-273031, filed Sep. 27, 1999. The entire contents of each of the above mentioned related applications is hereby incorporated by reference herein as if fully set forth.

BACKGROUND

The present invention relates to a method and apparatus for processing a substrate by spraying a processing solution onto the substrate.

The process of manufacturing a photo mask used in a liquid crystal display device, a semiconductor device or in the manufacture thereof includes a lithography step for forming a circuit pattern on a substrate such as a glass substrate, a semiconductor wafer or a quartz substrate by using the photo mask.

For forming a circuit pattern on the substrate in the lithography process, the steps of forming a resist pattern on the substrate, etching the substrate by using the resist pattern as a mask, removing the resist pattern after the etching step, and forming a film on the substrate having the resist pattern removed therefrom are repeated a plurality of times.

Where the substrate is a photo mask used in the manufacture of a liquid crystal display device or a semiconductor device, an insoluble resist that is unlikely to be dissolved in a solvent is used for forming a pattern. If the pattern is formed by using the insoluble resist, it is difficult to peel off the pattern by the ordinary method. Thus, a plasma asking is employed for removing the resist pattern.

However, the plasma asking invites an increased manufacturing cost and a low through-put.

Under the circumstances, a new technique replacing the plasma asking is disclosed in, for example, Japanese Patent Disclosure (Kokai) No. 6-29270 and Japanese Patent Disclosure No. 6-291098. Specifically, it is disclosed that the resist pattern is peeled off by using a mixed solution consisting of sulfuric acid and hydrogen peroxide solution, followed by supplying a pure water onto the substrate for the rinsing treatment.

However, the prior art exemplified above is defective in that, in rinsing the substrate with a pure water after peeling of the resist pattern off the substrate with the mixed solution, the pure water tends to bring about a dissolving reaction with the sulfuric acid remaining on the substrate. What should be noted is that the dissolving reaction brings about the mist generation and scattering of the sulfuric acid.

SUMMARY

An object of the present invention is to provide a method and apparatus for processing a substrate, which permits suppressing the dissolving reaction between sulfuric acid used as a first process solution and a rinsing solution used as a second process solution in the case where the substrate is processed with the second process solution after the processing with the first process solution.

According to a first aspect of the present invention, there is provided a method of processing a substrate, in which the substrate is processed successively with a plurality of different kinds of process solutions, comprising:

a first step of processing the substrate with a first process solution prepared by mixing sulfuric acid and hydrogen peroxide solution;

a second step of supplying a hydrogen peroxide solution alone to the substrate after completion of the processing with the first process solution; and a third step of supplying a second process solution for rinsing the substrate to the substrate after supply of the hydrogen peroxide solution alone for a predetermined period of time.

According to another aspect of the present invention, there is provided an apparatus for processing a substrate, in which the substrate is successively processed with a plurality of different kinds of process solutions, comprising:

a spin chuck supporting the substrate;

a driving source for rotating the spin chuck;

a nozzle member for supplying a first process solution prepared by mixing sulfuric acid and a hydrogen peroxide solution at a predetermined mixing ratio to the substrate supported by the spin chuck and second process solution for rinsing the substrate to the substrate;

a switching mechanism for selecting sulfuric acid; the hydrogen peroxide solution and the second process solution supplied to the nozzle member;

a concentration adjusting mechanism for adjusting the mixing ratio of sulfuric acid to the hydrogen peroxide solution, which collectively form the first process solution, supplied to the nozzle member;

and a control device for controlling the supply of sulfuric acid, the hydrogen peroxide solution and the second process solution, which is switched by the switching mechanism, and the adjustment of the mixing ratio of sulfuric acid to the hydrogen peroxide solution, which is performed by the concentration adjusting mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWING(S)

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 schematically shows the construction of a substrate processing apparatus according to a first embodiment of the present invention;

FIG. 3A is a cross sectional view showing in a magnified fashion a liquid spurting hole portion of the nozzle member;

FIG. 3B is a cross sectional view along the line 3B—3B shown in FIG. 3A;

FIG. 5 is a cross sectional view showing the nozzle member according to a second embodiment of the present invention; and FIG. 6 is a cross sectional view showing the nozzle member according to a third embodiment of the present invention.

DETAILED DESCRIPTION OF THE PREFERRED EMBODIMENT(S)

Some embodiments of the present invention will now be described with reference to the accompanying drawings.

Figure 1:
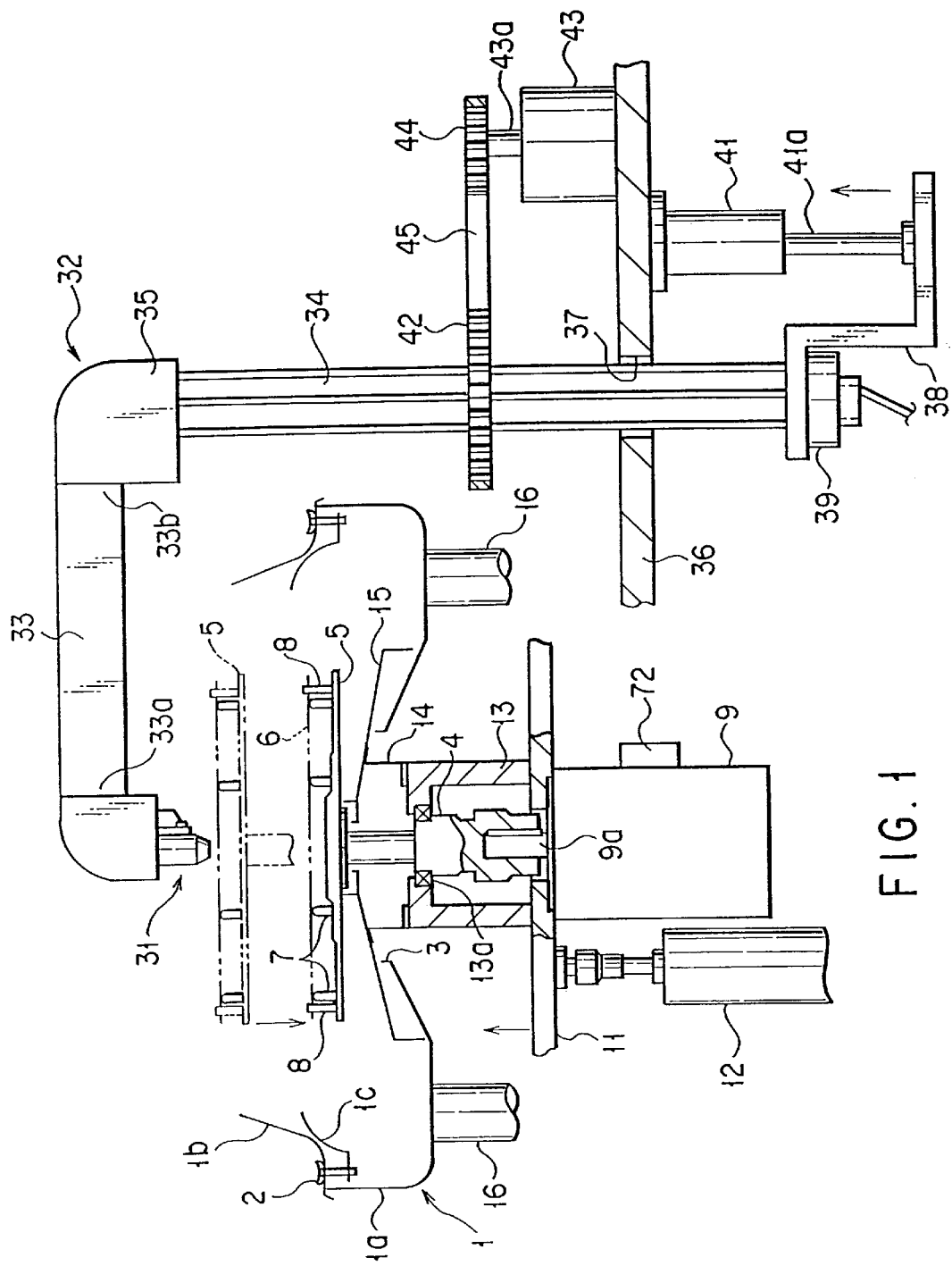

FIGS. 1 to 4 collectively show a first embodiment of the present invention. Specifically, FIG. 1 shows a processing apparatus of a substrate. As shown in the drawing, the processing apparatus comprises a cup body 1 consisting of a lower cup 1a having a bottom and an open upper end, an upper cup 1b detachably mounted to the upper end of the lower cup 1a, and an intermediate cup 1c detachably mounted to the inner surface of the upper cup 1b by a screw 2.

A through-hole 3 is formed in the central portion of the bottom portion of the lower cup 1a. A rotary shaft 4 is inserted into the through-hole 3. The upper end of the rotary shaft 4 projecting into the cup body 1 is mounted to the lower surface of a spin chuck 5 arranged within the cup body 1. A substrate 6 such as a glass substrate used in a liquid crystal display device is mounted on the upper surface of the spin chuck 5. The spin chuck 5 is provided with a plurality of support pins 7 for supporting the lower surface of the substrate 6 and with a plurality of engaging pins 8 engaged with the outer circumferential surface of the substrate 6.

The lower end portion of the rotor 4 projecting to the outside of the lower cup 1a through the through-hole 3 is joined to a rotary shaft 9a of a first motor 9. It follows that, if the first motor 9 is rotated, the spin chuck 5 is rotated together with the substrate 6.

The first motor 9 is mounted to a first mounting plate 11. The first mounting plate 11 can be moved up and down by a first cylinder 12. If the first mounting plate 11 is moved upward, the spin chuck 5 is moved from the upper surface of the cup body 1 to reach a height denoted by broken line in FIG. 1. As a result, the substrate 6 can be mounted to and removed from the spin chuck 5 by, for example, a robot (not shown).

A support body 13 is mounted to the upper surface of the first mounting plate 11. The support body 13 is provided with a bearing 13a rotatably supporting the rotary shaft 4. A supporting leg 14 is mounted to the support body 13. The supporting leg 14 projects upward into the lower cup 1a through the through-hole 3, and a cover 15 covering the through-hole 3 is mounted to the upper end of the supporting leg 14. The cover 15 is moved up and down together with the spin chuck 5. It follows that, even when the spin chuck 5 is in the elevated position, the cover 15 covers the through-hole 3.

The cover 15 is inclined downward in the radial direction from the center toward the periphery. Therefore, the process solution dripping onto the upper surface of the cover 15 flows along the inclined surface so as to drip into the lower cup 1a. A plurality of discharge pipes 16 are connected to the bottom portion of the periphery of the lower cup 1a so as to permit the process solution dripping into the lower cup 1a to be discharged to the outside. Incidentally, a suction pump (not shown) is connected to the discharge pipe 16.

A nozzle member 31 for spurting a process solution onto the substrate 6 held by the spin chuck 5 is arranged above the spin chuck 5. The nozzle member 31 is rocked in the radial direction of the substrate 6 by a rotating mechanism 32. The rotating mechanism 32 is provided with a cylindrical horizontal arm 33, and the nozzle member 31 is mounted to a tip portion 33a of the horizontal arm 33.

A connecting member 35 is mounted to a proximal end portion 33b of the horizontal aim 33. The upper end of a hollow spline shaft 34 extending in a vertical direction and acting as a driving shaft is joined to the connecting member 35. The spline shaft 34 extends through a through-hole 37 formed in a second support plate 36. The lower end portion of the spline shaft 34 is rotatably supported by a bearing 39, which is mounted to one end portion of a crank-shaped mounting plate 38.

A second cylinder 41 is mounted to the second support plate 36. A rod 41a of the second cylinder 41 is joined to the other end portion of the mounting plate 38. Therefore, if the rod 41a of the second cylinder 41 is moved upward into the second cylinder 41, the spline shaft 34 is driven upward via the mounting plate 38.

A driven pulley 42 is mounted to an intermediate portion of the spline shaft 34 such that the driven pulley 42 is capable of sliding along the spline shaft 34 and rotatable together with the spline shaft 34. A second motor 43 is mounted to the second support plate 36. A driving pulley 44 is engaged with a rotary shaft 43a of the second motor 43. Further, a timing belt 45 is stretched between the driving pulley 44 and the driven pulley 42. It follows that, if the second motor 43 is rotated, the spline shaft 34 is also rotated.

If the spline shaft 34 is rotated, the horizontal arm 33 is interlocked with the rotation of the spline shaft 34. Therefore, the nozzle member 31 mounted to the tip portion 33a of the horizontal arm 33 is moved in the radial direction the substrate 6 held by the spin chuck 5. In other words, the horizontal arm 33 is reciprocated within a predetermined range of angle by the second motor 43.

Incidentally, the movement of the driven pulley 42 in the vertical direction is restricted by a holding member (not shown), though the rotation of the driven pulley 42 is not inhibited. Therefore, even if the spline shaft 43 is driven in the vertical direction by the second cylinder 41, the driven pulley 42 is not moved in the vertical direction together with the spline shaft 34.

Figure 2:
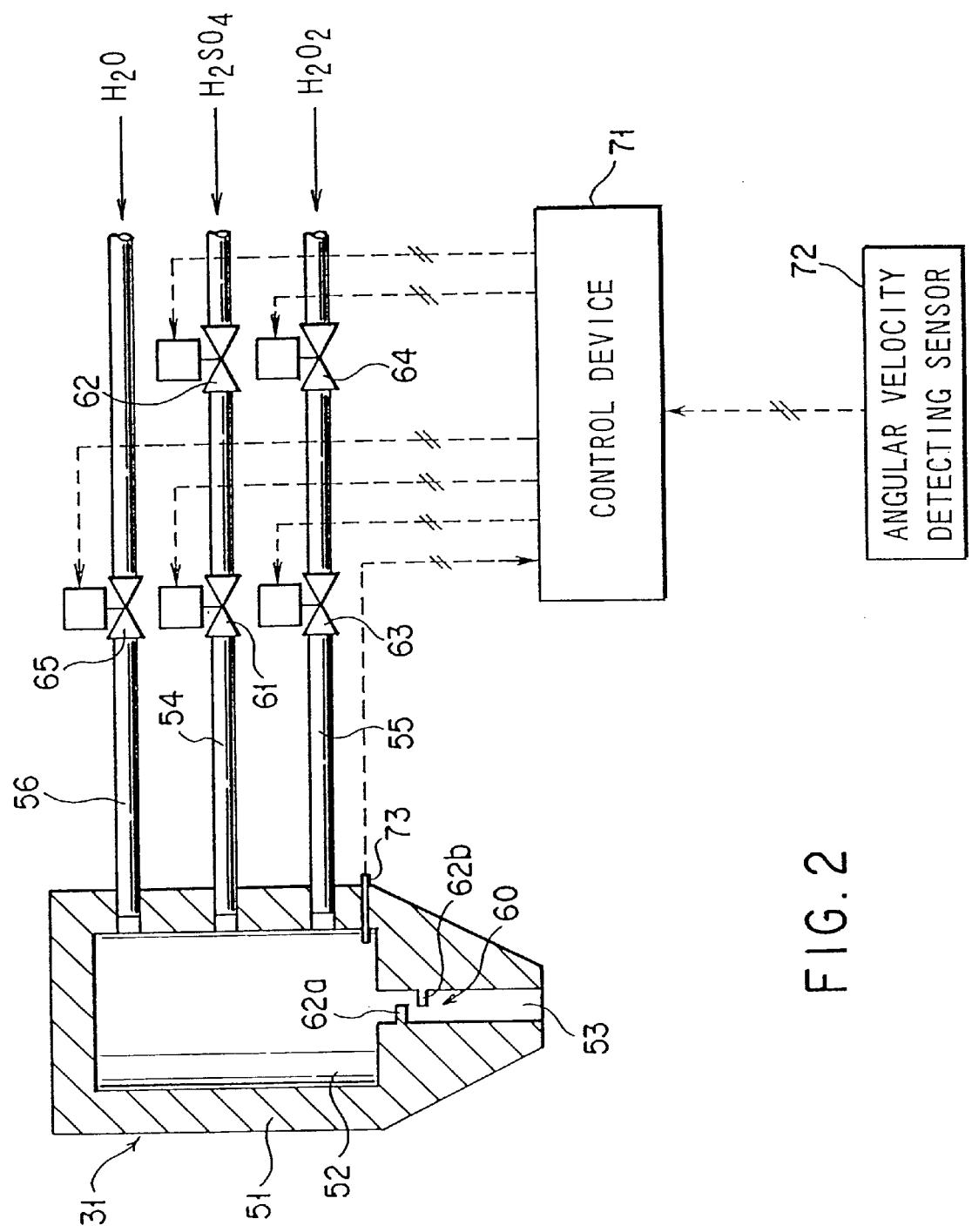
FIG. 2 shows the piping system for supplying a process solution to the nozzle member.

The nozzle member 31 includes a nozzle body 51 as shown in FIG. 2. A mixing chamber 52 is formed within the nozzle body 51, and formed is a spurting hole 53 with one end communicating with the mixing chamber 52 and the other end open at the tip surface of the nozzle body 51.

Connected to the mixing chamber 52 are a first supply pipe 54, a second supply pipe 55 and a third supply pipe 56. Sulfuric acid ($H_2SO_4$) is supplied through the first pipe 54 into the mixing chamber 52. Also, a hydrogen peroxide ($H_2O_2$) solution is supplied through the second supply pipe 55 into the mixing chamber 55. The sulfuric acid and the hydrogen peroxide solution are mixed within the mixing chamber 52 so as to prepare a first process solution. On the other hand, a pure water for rinsing the substrate 6 is supplied as a second process solution through the third supply pipe 56 into the mixing chamber 52.

Heat of solution is generated when the sulfuric acid and the hydrogen peroxide solution are mixed within the mixing chamber 52 for preparing the first process solution. As a result, the temperature of the first process solution is spurted through the spurting hole 53 of the nozzle member 31 toward the substrate 6. The temperature of the first process solution can be controlled by changing the mixing ratio of the sulfuric acid to the hydrogen peroxide solution.

It is possible for the sulfuric acid and the hydrogen peroxide solution not to be mixed sufficiently within the mixing chamber 52 of the nozzle member 31 so as to be spurted separately through the spurting hole 53 toward the substrate 6. In such a case, the temperature of the first process solution is not sufficiently elevated, resulting in failure to process the substrate 6 sufficiently and smoothly.

To overcome the above-noted difficulty, each of the first and second process solutions supplied into the mixing chamber 52 of the nozzle member 31 is sufficiently mixed by a mixing mechanism 60 mounted within the nozzle member 31 and, then, spurted through the spurting hole 53 toward the substrate 6.

As shown in FIGS. 3A and 3B, the mixing mechanism 60 comprises two baffle members 62a, 62b arranged within the spurting hole 53. Each of these baffle members 62a, 62b is substantially semicircular and sized slightly larger than a half of the cross sectional size of the spurting hole 53. Also, these baffle members 62a, 62b are arranged a predetermined distance apart from each other in the axial direction of the spurting hole 53 and arranged deviant from each other by substantially 180° in the circumferential direction.

Because of the presence of the baffle members 62a, 62b, each of the first and second process solutions flowing from the mixing chamber 52 into the spurting hole 53 forms an eddy current as denoted by arrows in FIG. 3A. It follows that, even if each of these process solutions is not sufficiently mixed within the mixing chamber 52, each of these process solutions is sufficiently mixed when passing through the spurting hole 53.

A first opening-closing valve 61 and a first flow rate control valve 62 are mounted to the first supply pipe 54. Also, a second opening-closing valve 63 and a second flow rate control valve 64 are mounted to the second supply pipe 55. Further, a third opening-closing valve 65 is mounted to the third supply pipe 56.

The operation of each of these first, second and third opening-closing valves 61, 63, 65 is controlled by a control device 71. Likewise, the degree of opening of each of the first and second flow rate control valves 62 and 64 is controlled by the control device 71.

The control device 71 controls the degree of opening of each of the flow rate control valves 62 and 64 in accordance with the peripheral speed of the substrate 6 that is determined by the diameter and the angular velocity of the substrate 6. As a result, the spurting amount of the first process solution spurted from the nozzle member 31 toward the substrate 6 and the mixing ratio of sulfuric acid and the hydrogen peroxide solution are controlled.

The angular velocity of the substrate 6, i.e., the angular velocity of the spin chuck 5, is detected by an angular velocity detecting sensor 72 mounted to the first motor 9, and a signal denoting the detected angular velocity is supplied to the control device 71.

Where the first process solution is supplied to the central portion of the substrate 6, the temperature drop in the peripheral portion of the substrate 6, compared with the temperature in the central portion, is increased with increase in the peripheral speed of the substrate 6 that is determined by the angular velocity and the radius of the substrate 6. It follows that, if the amount of the first solution supplied to the substrate 6 is controlled in accordance with the change in the angular velocity of the substrate 6 detected by the angular velocity detecting sensor 72, i.e., in accordance with the change in the peripheral speed of the substrate 6, it is possible to diminish the difference in temperature between the central portion and the peripheral portion of the substrate 6.

The supply amount of the first process solution is adjusted by increasing the flow rates of both sulfuric acid and the hydrogen peroxide solution without changing the ratio of sulfuric acid to the hydrogen peroxide solution that are controlled by the first flow rate control valve 62 and the second flow rate control valve 64.

A temperature sensor 73 for detecting the temperature of the mixed process solution is arranged within the mixing chamber 52 of the nozzle member 31. A signal of the temperature sensor 73 denoting the detected temperature is supplied to the control device 71. As a result, the degree of opening of each of the first and second flow rate control valves 62 and 64 is controlled so as to change the mixing ratio of sulfuric acid to the hydrogen peroxide solution, thereby changing the temperature of the first process solution. In other words, the temperature of the substrate 6 can be controlled by the control device 71 on the basis of the detection signal of the angular velocity detecting sensor 72 and the detection signal of the temperature sensor 73.

The opening-closing valves 61, 63, 65 mounted to the first, second and third supply pipes 54, 55, 56, respectively, are selectively opened or closed by the control device 71. To be more specific, when the first process solution is supplied, the control device 71 permits the first opening-closing valve 61 and the second opening-closing valve 63 to be opened. On the other hand, when the second process solution is supplied, the control device 71 permits the third opening-closing valve 65 to be opened.

Suppose a resist film or an organic film formed on the substrate 6 is unlikely to be dissolved in a solvent. In this case, the resist film or the organic film is removed by the processing apparatus of the construction described above as follows. In the first step, the substrate 6 is disposed on the spin chuck 5 and, then, the spin chuck 5 is rotated. At the same time, the nozzle member 31 is positioned above the central portion of the substrate 6.

When the processing of the substrate 6 is started by operating the control device 71 under this condition, the first and second opening-closing valves 61 and 63 are opened. At the same time, the first and second flow rate control valves 62 and 64 are opened with an opening degree conforming with the angular velocity of the substrate 6. As a result, sulfuric acid and a hydrogen peroxide solution are supplied at predetermined rates through the first supply pipe 54 and the second supply pipe 55, respectively, into the mixing chamber 52 of the nozzle member 31.

The sulfuric acid and hydrogen peroxide solution flow into the mixing chamber 52 and collide against the two baffle members 621, 62b arranged within the spurting hole 53 and collectively constituting the mixing mechanism 60 so as to form an eddy current. As a result, the sulfuric acid and hydrogen peroxide solution are sufficiently mixed to form the first process solution, which is spurted from the spurting hole 53 toward the central portion of the substrate 6.

The first solution prepared by mixing the sulfuric acid and hydrogen peroxide solution generates heat of solution. As a result, the temperature of the first process solution is elevated, and the first process solution is caused to flow centrifugally from the central portion toward the peripheral portion of the substrate 6. It follows that the resist pattern or the organic film formed on the substrate 6 is decomposed by the first process solution.

In performing the decomposition treatment, the substrate 6 is heated to a predetermined temperature by the heat of solution generated from the first process solution. As a result, the decomposition treatment of, for example, the resist pattern formed on the substrate 6 is promoted so as to further improve the effect of the processing. To be more specific, since the substrate 6 is processed by utilizing the heat of solution of the first process solution, it is unnecessary to heat the substrate 6 and the process solution to high temperatures, making it possible to carry out easily the heat treatment of the substrate 6.

The sulfuric acid and the hydrogen peroxide solution are mixed within the mixing chamber 52 formed within the nozzle member 31 to form the first process solution. In addition, the first process solution is caused to form an eddy current by the two baffle members 62a, 62 collectively forming the mixing mechanism 60 within the spurting hole 53 so as to achieve a satisfactory mixing of the sulfuric acid and the hydrogen peroxide solution. This makes it unnecessary to mix in advance the sulfuric acid the hydrogen peroxide solution, with the result that the construction of the entire apparatus can be simplified.

The first and second flow rate control valves 62 and 64 are mounted, respectively, to the first and second supply pipes 54 and 55 for supplying sulfuric acid and hydrogen peroxide solution to the nozzle member 31. Also, the degree of opening of each of the first and second flow rate control valves 62 and 64 is controlled on the basis of the peripheral speed of the substrate 6 and the temperature of the first process solution within the mixing chamber 52. To be more specific, the supply rate of the first process solution is controlled in proportion to the change in the peripheral speed of the rotating substrate 6, and the ratio of sulfuric acid contained in the first process solution is controlled on the basis of the temperature of the first process solution within the mixing chamber 53. As a result, the substrate 6 is heated to a substantially uniform temperature by the first process solution having a predetermined temperature, making it possible to process the substrate 6 without fail.

The nozzle member 31 is mounted to the horizontal arm 33 of the rotating mechanism 32. Therefore, the first process solution can be spurted from the nozzle member 31 mounted to the tip portion 33a of the horizontal arm 33 toward the substrate 6 while reciprocating the horizontal arm 33 in the radial direction of the substrate 6.

If the horizontal arm 33 is driven, the first process solution is uniformly supplied from the nozzle member 31 to the substrate 6, making it possible to process the entire surface of the substrate 6 more uniformly.

Where the nozzle member 31 is reciprocated in the radial direction of the substrate 6, the temperature of the first process solution on the substrate 6 is scarcely changed by the difference in the peripheral speed between the central portion and the peripheral portion of the substrate 6. Therefore, it suffices for the control device 71 to control only the mixing ratio of sulfuric acid to the hydrogen peroxide solution depending on the temperature of the first process solution within the mixing chamber 52, which is detected by the temperature sensor 73.

Incidentally, it is possible to supply a predetermined amount of the first process solution intermittently in place of supplying the first process solution continuously where the first process solution is supplied intermittently, the first process solution is newly supplied to the substrate 6 after the reaction such as the decomposing reaction of the first process solution supplied first has sufficiently proceeded. Therefore, the efficiency of use of the first process solution is improved, making it possible to decrease the amount of the first process solution used.

Figure 4:
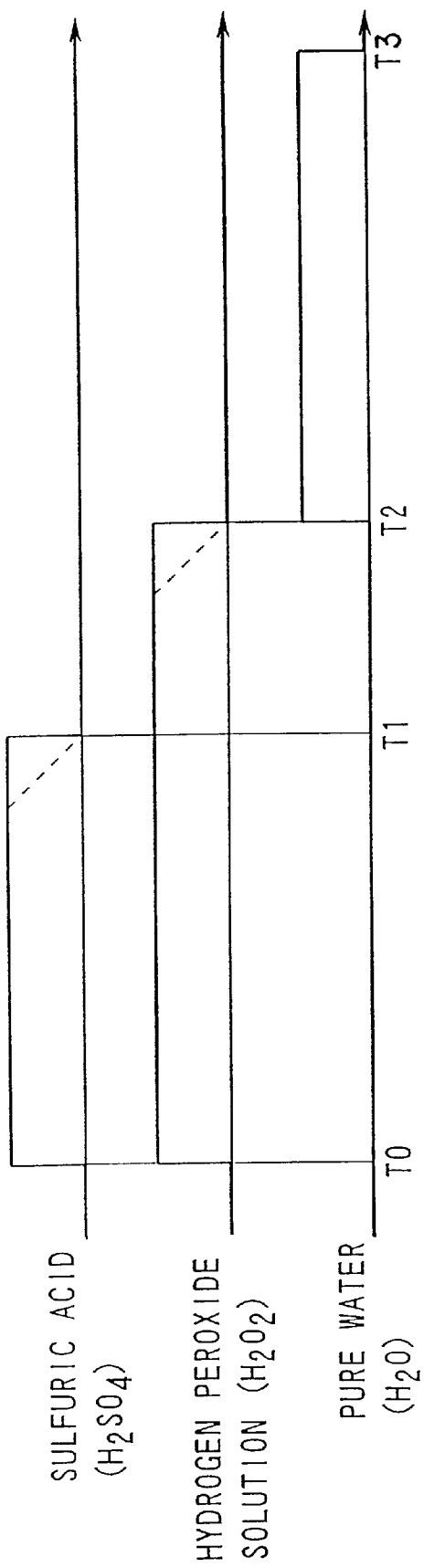
FIG. 4 is a time chart showing the timings of supplying sulfuric acid, a hydrogen peroxide solution and a pure water.

FIG. 4 is a time chart showing the timing of supplying sulfuric acid, a hydrogen peroxide solution and a pure water.

At the process starting time T0, sulfuric acid and the hydrogen peroxide solution, which collectively form the first process solution, are supplied to the substrate 6. After the processing with the first process solution is continued until time T1, the first opening-closing valve 61 is closed so as to stop supply of sulfuric acid, and the hydrogen peroxide solution alone is supplied until time T2. Since the hydrogen peroxide solution alone is supplied during the period between time T1 and time T2, the sulfuric acid within the nozzle member 31 and attached to the substrate 6 and the cup body 1 is diluted with the hydrogen peroxide solution into a low concentration.

After the hydrogen peroxide solution is supplied until time T2, the second opening-closing valve 63 is closed, and the third valve 65 mounted to the third supply pipe 56 is opened so as to supply a second process solution consisting of a rinsing solution (pure water) from the nozzle member 31 to the substrate 6. The rinsing solution is continued to be supplied until time T3 so as to permit the substrate 6 to be rinsed with the rinsing solution. It should be noted that, when the substrate 6 is rinsed with the second process solution, the sulfuric acid contained in the first process solution and remaining on the substrate 6 and within the cup body 1 is sufficiently diluted with the hydrogen peroxide solution into a low concentration. Therefore, even if the second process solution (pure water) is mixed with the sulfuric acid contained in the first process solution and attached to the substrate 6 and the cup body 1, a dissolving reaction (chemical reaction) between the pure water and the sulfuric acid does not take place because the sulfuric acid concentration in the first process solution is sufficiently low. In other words, since a dissolving reaction between the pure water and sulfuric acid does not take place, the substrate 6 is not contaminated by the mist generation and scattering of sulfuric acid.

When the substrate 6 is rinsed with the second process solution until time T3, the supply of the second process solution is stopped and the substrate 6 is rotated at a high speed so as to centrifugally remove the rinsing solution attached to the substrate 6 and, thus, to dry the substrate 6, thereby finishing a series of the processing.

Incidentally, as denoted by broken lines in FIG. 4, it is possible to operate the first flow rate control valve 62 and the second flow rate control valve 64 in a manner to stop gradually the supply of sulfuric acid and the hydrogen peroxide solution.

In the first embodiment described above, a glass substrate is used as the substrate 6. Alternatively, it is also possible to use a semiconductor wafer or a substrate for a photo mask as the substrate 6, as far as a resist pattern or an organic film is removed by utilizing the decomposing reaction.

Also, in the first embodiment described above, the two baffle members 62a, 62b are arranged within the spurting hole 53 as a mixing means of the process solution. Alternatively, it is also possible to arrange two baffle members 62a, 62b, which are substantially semicircular, within the mixing chamber 52 in a manner to be deviant from each other by 180° in the circumferential direction, as shown in FIG. 5 (second embodiment).

FIG. 6 shows a third embodiment of the present invention. In this embodiment, the nozzle member 31 is divided into the nozzle body 51 having the mixing chamber 52 formed therein and a nozzle outlet body 75 forming the spurting hole 53. The nozzle outlet body 75 forming the spurting hole 53. The nozzle outlet body 75 is connected liquid light to the nozzle body 51 so as to form the nozzle member 31. Further, the two semicircular baffle members 62a, 62b are formed within the nozzle outlet body 75 so as to form the mixing mechanism 60 for mixing the sulfuric acid and the hydrogen peroxide solution collectively forming the first process solution.

Where the nozzle member 31 is divided into the nozzle body 51 and the nozzle outlet body 75 as shown in FIG. 6, the baffle members 62a, 62b can be mounted easily within the nozzle outlet body 75. Incidentally, it is possible to form the baffle members 62a, 62b integral with the nozzle outlet body 75, or to mount the baffle members 62a, 62b formed separately within the nozzle outlet body 75.

In the third embodiment described above, it is possible to arrange the baffle members 62a, 62b within the mixing chamber 52 of the nozzle body 51, though the particular arrangement is not shown in the drawing.

In the third embodiment, the shape and the number of baffle members 62a, 62b of the mixing mechanism 61 are not particularly limited, as far as the process solution supplied to the mixing chamber 52 is sufficiently mixed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for processing a substrate, in which the substrate is successively processed with a plurality of different kinds of process solutions, comprising: a spin chuck supporting the substrate; a driving source for rotating the spin chuck; a nozzle member for supplying a first process solution prepared by mixing sulfuric acid and a hydrogen peroxide solution at a predetermined mixing ratio to the substrate supported by the spin chuck and second process solution for rinsing the substrate to the substrate; a switching mechanism for selecting the sulfuric acid, the hydrogen peroxide solution and the second process solution supplied to the nozzle member; a concentration adjusting mechanism for adjusting the mixing ratio of the sulfuric acid to the hydrogen peroxide solution, which collectively form the first process solution, supplied to the nozzle member; and a control device for controlling the supply of the sulfuric acid, the hydrogen peroxide solution and the second process solution, which is switched by the switching mechanism and for controlling the concentration adjusting mechanism which adjusts the mixing ratio of the sulfuric acid to the hydrogen peroxide solution.

2. The apparatus for processing a substrate according to claim 1, wherein each of a first supply pipe for supplying the sulfuric acid, a second supply pipe for supplying the hydrogen peroxide solution, and a third supply pipe for supplying the second process solution is connected to the nozzle member.

3. The apparatus for processing a substrate according to claim 1, wherein a temperature sensor for detecting the temperature of the first process solution is mounted to the nozzle member, and the control device serves to control the concentration adjusting mechanism in accordance with the temperature of the first process solution detected by the temperature sensor so as to adjust the concentrations of the sulfuric acid and the hydrogen peroxide solution, which collectively form the first process solution.

4. The apparatus for processing a substrate according to claim 1, wherein an angular velocity detecting sensor for detecting the angular velocity of the spin chuck is connected to the control device to enable the control device to control the concentration adjusting mechanism depending on the angular velocity of the spin chuck detected by the angular velocity detecting sensor so as to adjust the mixing ratio of the sulfuric acid to the hydrogen peroxide solution, which collectively form the first process solution.

5. The apparatus for processing a substrate according to claim 1, wherein a mixing mechanism for mixing the sulfuric acid and the hydrogen peroxide solution, which collectively form the first process solution, supplied to the nozzle member is arranged within the nozzle member.

6. The apparatus for processing a substrate according to claim 1, wherein an arm body having a distal end portion and a proximal end portion is arranged above the spin chucks said nozzle member being mounted to the distal end portion, and a driving mechanism being connected to the proximal end portion for driving said arm body and the nozzle member in a radial direction of the substrate held by the spin chuck.

7. The apparatus for processing a substrate according to claim 2, wherein the switching mechanism consists of opening-closing valves mounted to a first, to the second, and to the third supply pipes.

8. The apparatus for processing a substrate according to claim 2, wherein the concentration adjusting mechanism consists of flow rate control valves mounted to the first supply pipe and the second supply pipe.

9. The apparatus for processing a substrate according to claim 5, wherein the nozzle member comprises a mixing chamber into which said sulfuric acid and the hydrogen peroxide solution flow and a spurting hole for spurting the mixture of the sulfuric acid and the hydrogen peroxide solution flowing into the mixing chamber, and the mixing mechanism consists of baffle members arranged within the spurting hole for converting the streams of said sulfuric acid and said hydrogen peroxide solution into an eddy current.

\* \* \* \* \*

UNITED STATES PATENT AND TRADEMARK OFFICE
CERTIFICATE OF CORRECTION

PATENT NO. : 6,363,950 B2
DATED : April 2, 2002
INVENTOR(S) : Nishibe et al.

It is certified that error appears in the above-identified patent and that said Letters Patent is hereby corrected as shown below:

Column 10,
Line 29, delete "chucks" and insert therefor -- chuck, --.

Signed and Sealed this

Eleventh Day of June, 2002

JAMES E. ROGAN
*Director of the United States Patent and Trademark Office*

*Attest:*

*Attesting Officer*